United States Patent
Chiou et al.

(10) Patent No.: US 9,997,440 B2
(45) Date of Patent: Jun. 12, 2018

(54) PROTECTION LAYER FOR ADHESIVE MATERIAL AT WAFER EDGE

(71) Applicant: TAIWAN SEMICONDUCTOR MANUFACTURING COMPANY, LTD., Hsinchu (TW)

(72) Inventors: Wen-Chih Chiou, Miaoli (TW); Weng-Jin Wu, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1057 days.

(21) Appl. No.: 13/864,676

(22) Filed: Apr. 17, 2013

(65) Prior Publication Data
US 2013/0228920 A1    Sep. 5, 2013

Related U.S. Application Data

(60) Division of application No. 13/560,200, filed on Jul. 27, 2012, now Pat. No. 8,441,136, which is a (Continued)

(51) Int. Cl.
H01L 23/498    (2006.01)
H01L 21/56    (2006.01)
(Continued)

(52) U.S. Cl.
CPC ...... *H01L 23/49811* (2013.01); *H01L 21/561* (2013.01); *H01L 21/6836* (2013.01);
(Continued)

(58) Field of Classification Search
None
See application file for complete search history.

(56) References Cited

U.S. PATENT DOCUMENTS 5,391,917 A   2/1995   Gilmour et al.
5,510,298 A   4/1996   Redwine
(Continued)

FOREIGN PATENT DOCUMENTS

CN   101017786   8/2007
JP   2002367942   12/2002
TW   200943583   10/2009

OTHER PUBLICATIONS

Office Action dated Aug. 15, 2013 from corresponding application No. TW 099130144.

*Primary Examiner* — Zandra Smith
*Assistant Examiner* — Abbigale Boyle
(74) *Attorney, Agent, or Firm* — Hauptman Ham, LLP

(57) ABSTRACT

A three-dimensional integrated circuit (3DIC) including a first substrate having a first surface and a second surface opposite to the first surface and a second substrate attached to the first surface of the first substrate. The 3DIC further includes an interconnect between attached to the first surface of the first substrate and the second substrate and a plurality of through vias formed in the first substrate and electrically coupled to the interconnect. The 3DIC further includes a protection layer over the second surface of the first substrate, wherein each of the plurality of through vias protrudes through the protection layer and a plurality of dies, each die of the plurality of dies attached to at least one through via of the plurality of through vias.

18 Claims, 6 Drawing Sheets

Related U.S. Application Data continuation of application No. 12/769,725, filed on Apr. 29, 2010, now Pat. No. 8,252,665.

(60) Provisional application No. 61/242,149, filed on Sep. 14, 2009.

(51) Int. Cl.
- H01L 21/683 (2006.01)
- H01L 23/00 (2006.01)
- H01L 25/00 (2006.01)
- H01L 21/768 (2006.01)

(52) U.S. Cl.
CPC .............. H01L 24/81 (2013.01); H01L 24/94 (2013.01); H01L 25/50 (2013.01); H01L 21/76898 (2013.01); H01L 2221/6834 (2013.01); H01L 2221/68381 (2013.01); H01L 2224/81001 (2013.01); H01L 2224/81801 (2013.01); H01L 2225/06513 (2013.01); H01L 2225/06541 (2013.01); H01L 2924/014 (2013.01); H01L 2924/0105 (2013.01); H01L 2924/01006 (2013.01); H01L 2924/01029 (2013.01); H01L 2924/01033 (2013.01); H01L 2924/01327 (2013.01); H01L 2924/09701 (2013.01); H01L 2924/10329 (2013.01); H01L 2924/14 (2013.01); H01L 2924/181 (2013.01); H01L 2924/19041 (2013.01)

(56) References Cited

U.S. PATENT DOCUMENTS

| | | | |
|---|---|---|---|
| 5,767,001 A | 6/1998 | Bertagnolli et al. | |
| 5,998,292 A | 12/1999 | Black et al. | |
| 6,184,060 B1 | 2/2001 | Siniaguine | |
| 6,214,702 B1 | 4/2001 | Kim | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,811,904 B2 | 10/2010 | Feng et al. | |
| 7,944,058 B2 * | 5/2011 | Ishihara | H01L 29/78 257/686 |
| 2002/0109236 A1 * | 8/2002 | Kim | H01L 23/481 257/777 |
| 2004/0180549 A1 | 9/2004 | Karasawa et al. | |
| 2005/0180549 A1 | 8/2005 | Chiu et al. | |
| 2006/0219351 A1 | 10/2006 | Kuan et al. | |
| 2007/0023758 A1 * | 2/2007 | Tsurume et al. | 257/66 |
| 2007/0029554 A1 * | 2/2007 | Nakamura et al. | 257/72 |
| 2008/0111213 A1 | 5/2008 | Akram et al. | |
| 2008/0211092 A1 * | 9/2008 | Lu | H01L 23/49811 257/737 |
| 2008/0237828 A1 | 10/2008 | Yang | |
| 2008/0268614 A1 | 10/2008 | Yang et al. | |

\* cited by examiner

PROTECTION LAYER FOR ADHESIVE MATERIAL AT WAFER EDGE

CROSS-REFERENCE TO RELATED APPLICATIONS

The present application is a Divisional of U.S. patent application Ser. No. 13/560,200, filed on Jul. 27, 2012, which is a Continuation of U.S. patent application Ser. No. 12/769,725, filed on Apr. 29, 2010, which claims priority of U.S. Provisional Patent Application Ser. No. 61/242,149 filed on Sep. 14, 2009, all of which are incorporated herein by reference in their entireties.

TECHNICAL FIELD

This disclosure relates to the fabrication of semiconductor devices, and more particularly, to the fabrication of three-dimensional (3D) integrated circuits (ICs).

BACKGROUND

The Semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. Three-dimensional (3D) integrated circuits (ICs) are therefore created to resolve the limitations of the number and length of interconnections between devices as the number of devices increases. Dies-to-wafer stack bonding is one method for forming 3D ICs, wherein one or more die is bonded to a wafer, and the size of dies may be smaller than the size of chips on the wafer. In order to reduce the thickness of semiconductor packages, increase the chip speed, and for high-density fabrication, efforts to reduce the thickness of a semiconductor wafer are in progress. Thickness reduction is performed by so-called backside grinding of a semiconductor wafer on the surface opposite that containing pattern-formed circuitry, on which a carrier is typically attached to support wafer handling through an adhesive material. Because the thinned wafer tends to have insufficient strength and is more susceptible to deformation such as bending and/or warping, a surface of the wafer is then encapsulated in a molding compound (e.g., thermo-curing epoxy resin), prior to the wafer being separated into individual chip packages using a dicing process. However, a portion of the adhesive material adjacent to the wafer edge is exposed, and which is easily attacked in subsequent etching process, e.g., a wet etch or dry etch process, causing a problem of temporary carrier boning and de-bonding processes. Conventionally an edge seal layer is provided on the edge of the adhesive material, but the following wafer thinning process exposes another portion of the adhesive material adjacent to the wafer edge.

DETAILED DESCRIPTION OF ILLUSTRATIVE EMBODIMENTS

In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, cross-sectional diagrams of FIG. 1A to FIG. 1F illustrate an exemplary embodiment of forming a die-to-wafer stack with a protection layer for an adhesive material at a wafer edge.

Figure 1A:
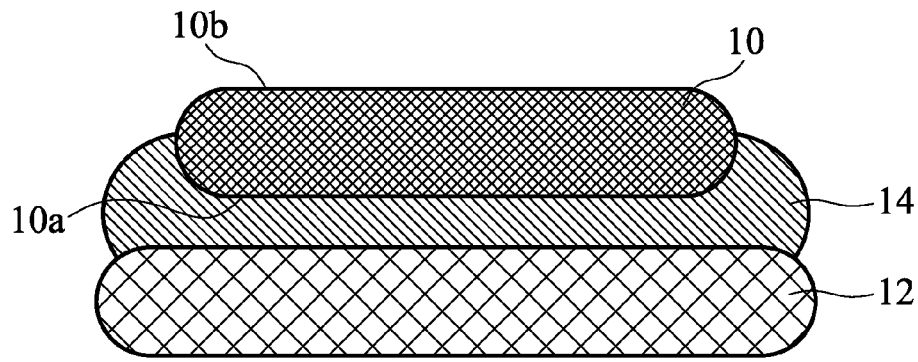
FIG. 1A to FIG. 1F are cross-sectional diagrams depicting an exemplary embodiment of forming a protection layer for an adhesive material at a wafer edge.

FIG. 1A is a cross-sectional view of one embodiment of a wafer 10 attached to a carrier 12 through an adhesive layer 14. A wafer 10 is provided with a plurality of semiconductor chips therein. The wafer 10 includes a semiconductor substrate such as silicon, gallium arsenide, a rock crystal wafer, sapphire, glass, quartz, ceramic, thermosetting materials, and the like. The wafer 10 has a first surface 10a and a second surface 10b opposite to the first surface 10a. On the first surface 10a, integrated circuits including active and passive devices such as transistors, resistors, capacitors and the like, are formed to connect bond pads and/or other interconnection structures. An adhesive layer 14 is applied on the first surface 10a, and then a carrier 12 is bonded to the adhesive layer 14 for enabling easier handling of the wafer 10 in subsequent processes. While doing so, the carrier 12 can be alternatively or cumulatively equipped with a corresponding adhesive surface. The carrier 12 is made of removable or dissolvable material such as glass, metal, ceramics, polymer, silicon, etc.

Figure 2A:
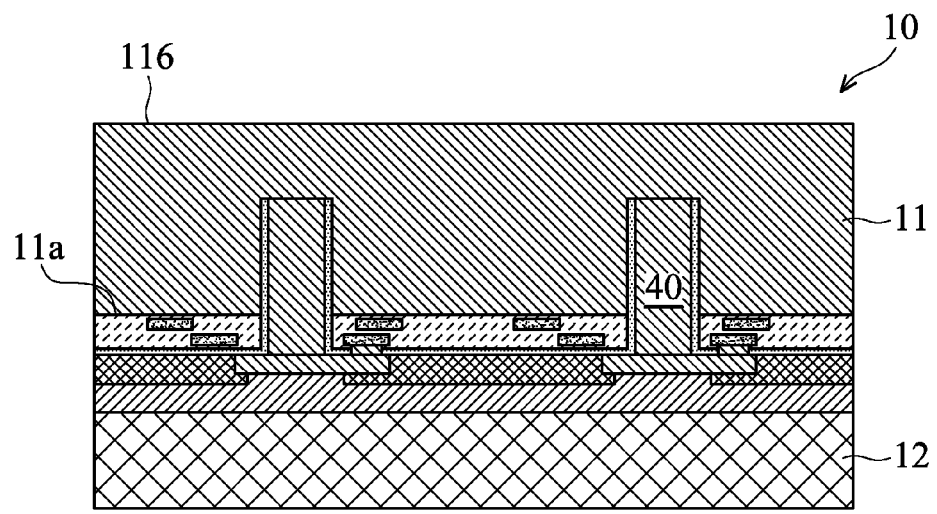
FIG. 2A to FIG. 2C are cross-sectional diagrams illustrating an exemplary embodiment of a method for handling a wafer including through vias.

In an exemplary embodiment, the wafer 10 includes a plurality of through silicon vias (TSVs) used for 3D IC applications. As shown in FIG. 2A, a wafer 10 comprises a semiconductor substrate 11 having a front surface 11a and a back surface 11b, wherein integrated circuits and interconnect structures are formed on the front surface 11a, and a plurality of through vias 40 passing through at least a part of the semiconductor substrate 11. The through via 40 is a metal-filled plug extending from the front surface 11a toward the back surface 11b and reaching an intended depth. The through via 40 can electrically connect a bond pad 42 formed on the interconnect structure. The fabrication of the through via 40 is performed before the fabrication of "first-level interconnection" which refers to a lowermost metal layer patterned in a lowermost inter-metal dielectric (IMD) layer overlying contact structures and transistors. Alternatively, the metal-filled via process is performed after the fabrication of interconnect structures.

Figure 1B:
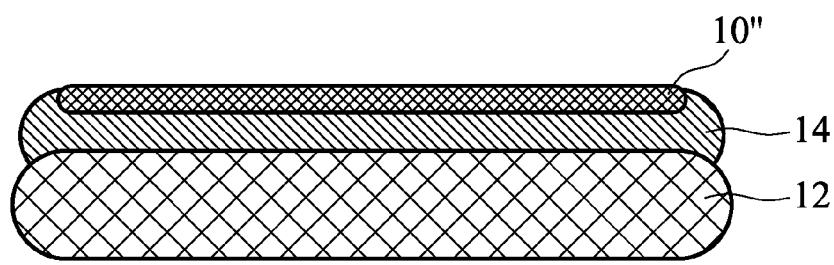
Figure 2B:
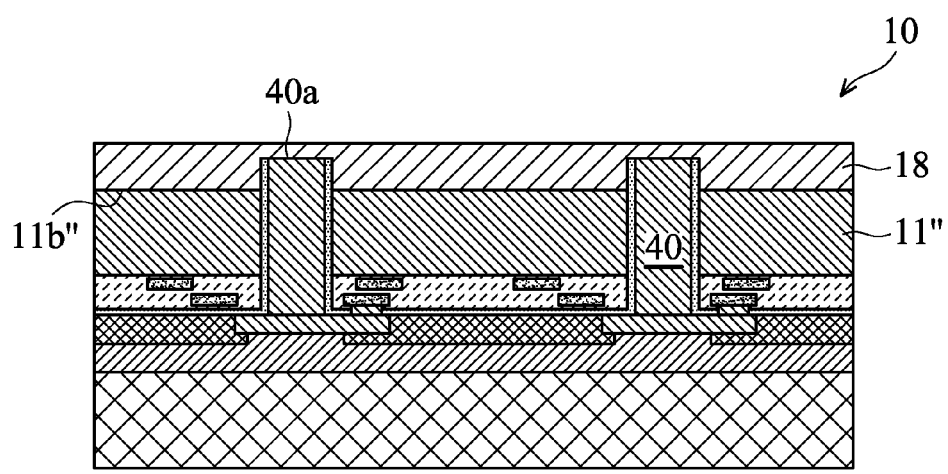

FIG. 1B is a cross-sectional view of the wafer 10 undergoing a wafer thinning process. After being attached to the carrier 12, the wafer 10 can be processed in its structure-free area (second surface 10b) to the desired final thickness. This can be done, for example, through grinding, etching, and/or polishing, resulting in a thinned wafer 10" with a predetermined thickness depending on the purpose for which the semiconductor package is used. In one embodiment, the wafer 10 is thinned to a thickness of from about 5 µm to about 50 µm. In another embodiment, the wafer 10 is thinned to a thickness of from about 25 µm to about 250 µm. In the exemplary embodiment of providing the wafer 10 including the through via 40, one end 40a of the through via 40 is exposed and/or protruded from the back surface 11b" of the thinned substrate 11" after the wafer thinning process as shown in FIG. 2B.

Figure 1C:
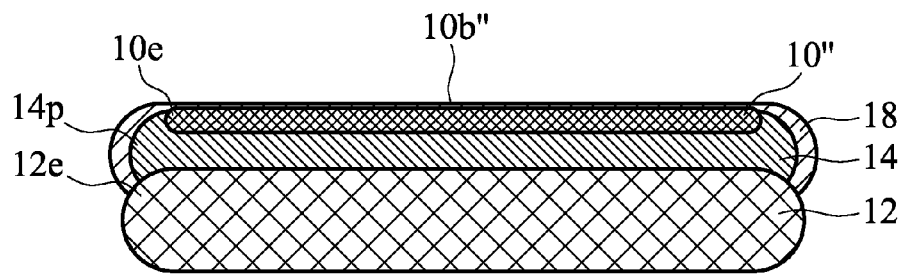

In order to avoid damage to the edge 10e of the thinned wafer 10" and the exposed portion 14p of adhesive layer 14 in the subsequent etching process, a protection layer 18 is formed to at least cover the edge 10e and the exposed portion 14p. The protection layer 18 may also extend to cover a portion of the carrier 12, for example the edge 12e of the carrier 12. The adhesive layer 14 covered by the protection layer 18 is therefore protected from subsequent etch processes. In an embodiment, as shown in FIG. 1C, the protective layer 18 is provided to cover the second surface 10b" of the thinned wafer 10" and the exposed portion 14p of the adhesive layer 14, and may extend to cover the edge 12e of the carrier 12. The protection layer 18 is formed of a dielectric material, for example an oxide film, a nitride film, a carbide film, a polymer-based material, resin-based material, polyimide, epoxy, SOG, spin-on materials, or combinations thereof by using chemical vapor deposition (CVD), physical vapor deposition (PVD), spin-on coating, injection, printing, or future-developed depositing processes. In the exemplary embodiment of providing the wafer 10 including the through via 40, the protection layer 18 is formed on the back surface 11b" of the thinned substrate 11" as shown in FIG. 2B, which may be partially removed in subsequent processing. FIG. 2B is an schematic view of the protection layer 18 overlying the back surface 11b", and any other process may be performed on the back surface 11b" before the forming of the protection layer 18.

Figure 1D:
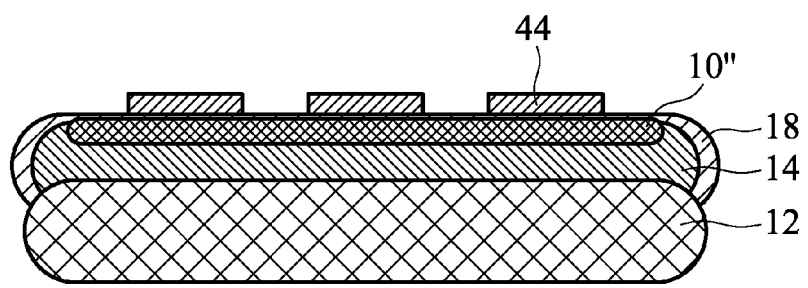
Figure 1E:
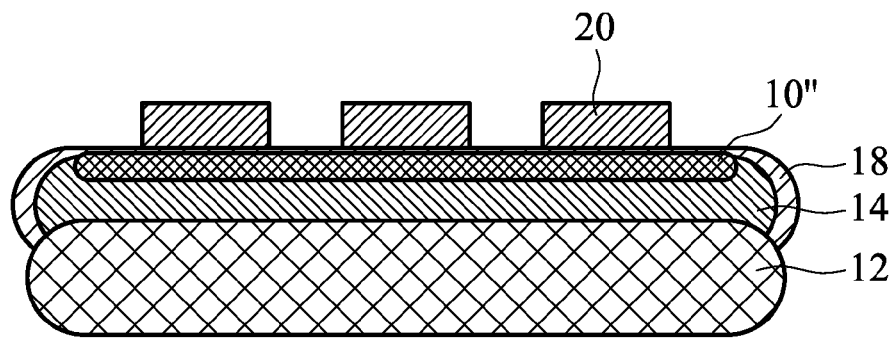
Figure 2C:
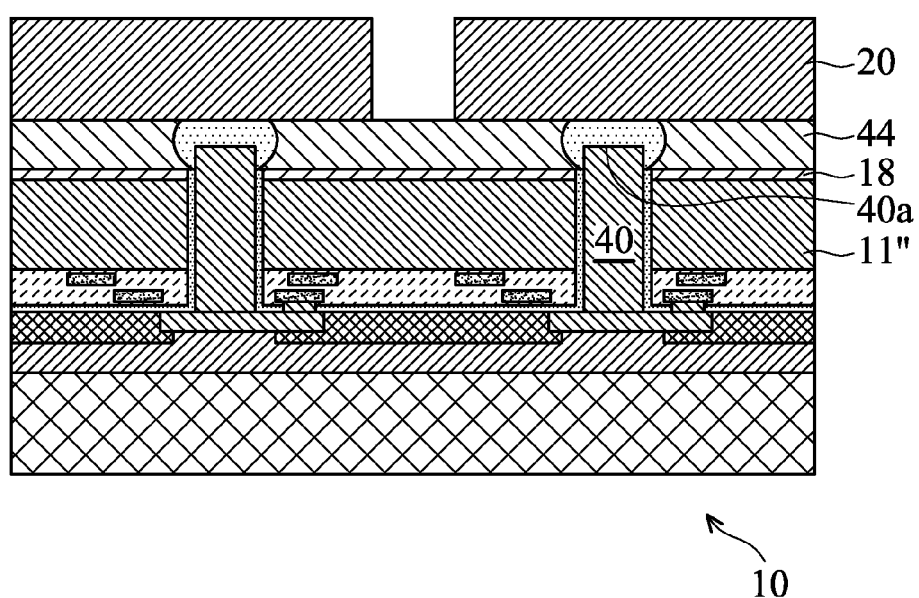

FIG. 1D and FIG. 1E are cross-sectional views of bonding a plurality of dies 20 onto the thinned wafer 10", forming a dies-to-wafer stack. Backside metallization including electrical connections and/or other structures (referring to conductive structures 44) are formed over the surface 10b" of the thinned wafer 10", and then dies 20 are bonded onto the thinned wafer 10" wherein the bonding methods include commonly used methods such as oxide-to-oxide bonding, oxide-to-silicon bonding, copper-to-copper bonding, adhesive bonding, and the like. The protection layer 18 may be partially removed in the backside metallization process to expose conductive regions for an external connection. The dies 20 may include memory chips, RF (radio frequency) chips, logic chips, or other chips. Each of the dies 20 has a first surface and a second surface, and integrated circuits are formed on the first surface. In one embodiment, the first surface of the die 20 is bonded onto the thinned wafer 10". In one embodiment, the second surface of the die 20 is bonded onto the thinned wafer 10". In the exemplary embodiment of providing the wafer 10 including the through via 40, conductive structures 44 such as solder bumps or copper bumps are formed over the ends 40a of the through vias 40 to bond to the second surface or the first surface of the die 20 as shown in FIG. 2C. The conductive structures 44 also include redistribution layers (RDLs) and pads which can be formed over the surface 10b" of the thinned wafer 10" before forming the solder bumps or copper bumps. The protection layer 18 may be partially removed in the backside metallization process, for example, being removed from the ends 40a of the through vias 40. In an embodiment, the protection layer 18 remains on the back surface 11b" of the thinned substrate 11".

Figure 1F:
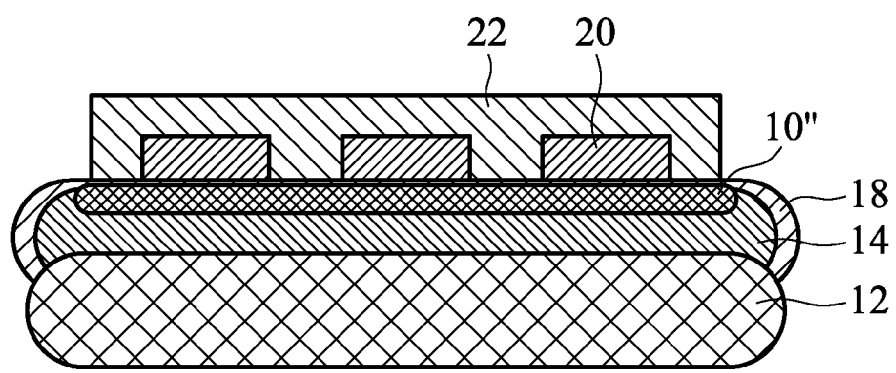

FIG. 1F is a cross-sectional view of a molding process performed on the dies-to-wafer stack. A molding compound 22 is coated over dies-to-wafer stack and fills the remaining spacing between adjacent dies 20, but may leave an uncovered region at the edge of the thinned wafer 10". The molding compound 22 is formed of a curable material such as, for example, a polymer-based material, resin-based material, polyimide, silicon oxide, epoxy, benzocyclobutenes (BCB), Silk™ (Dow Chemical), or a combination thereof. The molding process includes injection molding, compression molding, stencil printing, spin-on coating, or future-developed molding processes. After coating the molding compound 22, a curing or baking step is performed to solidify protection material.

Typically after wafer-level testing has been completed, a tape is laminated on top of the molding compound 22. Then the dies-to-wafer stack is detached from the carrier 12 to expose the first surface 10a of the thinned wafer 10". The detaching process is performed for example by using a solvent, by using UV irradiation or by being pulled off. Further, external contacts (e.g., solder bumps, copper-containing bumps or combinations thereof) of the individual semiconductor chips can be formed on the first surface 10a of the thinned wafer 10" for bonding to electrical terminals, where it is then diced in the usual manner along cutting lines to separate the encapsulated dies-to-wafer stack into individual semiconductor packages. After dicing, the stacked chip or chips are mounted on an IC card through, for example, an anisotropically conductive connection film.

Figure 3A:
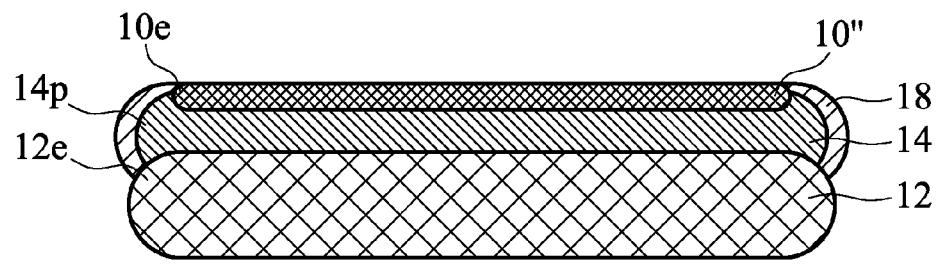
FIG. 3A to FIG. 3B are cross-sectional diagrams depicting an exemplary embodiment of forming a protection layer for an adhesive material at a wafer edge.
Figure 3B:
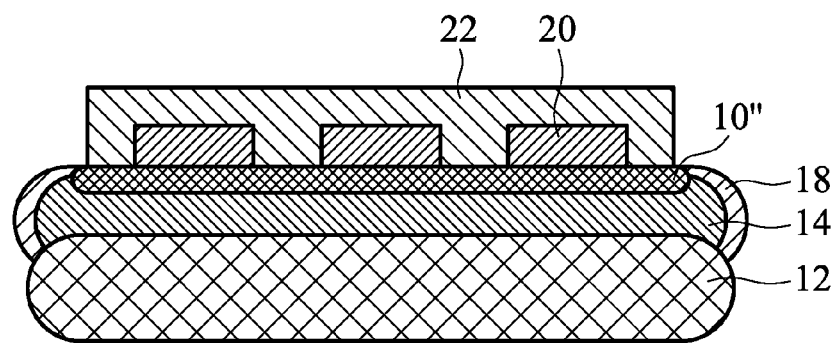

Cross-sectional diagrams of FIG. 3A to FIG. 3B illustrate an exemplary embodiment of forming a die-to-wafer stack with a protection layer for an adhesive material at a wafer edge. Explanation of the same or similar portions to the description in FIG. 1A to FIG. 1F and FIG. 2A to FIG. 2C is omitted herein. The wafer 10 is attached to the carrier 12 through the adhesive layer 14, and then the wafer 10 undergoes a wafer thinning process to the desired final thickness. In order to avoid damage to the exposed portion 14p of adhesive layer 14 in the subsequent etching process, the protection layer 18 is formed to cover the exposed portion 14p of the adhesive layer 14 adjacent to the wafer edge 10e after wafer thinning process as depicted in FIG. 3B. The protection layer 18 also extends to cover the edge 10e of the thinned wafer 10, without covering the whole of the exposed surface 10b". The protection layer 18 may further extends to cover the edge 12e of the carrier 12. None of the adhesive layer 14 is exposed, and the protection layer 18 protects the exposed portion 14p from the subsequent etching process. Thereafter, backside metallization including electrical connections and/or other structures are formed over the surface 10b" of the thinned wafer 10", and then dies 20 are bonded onto the thinned wafer 10". Next, the molding compound 22 is coated over dies-to-wafer stack and fills the remaining spacing between adjacent dies 20 as depicted in FIG. 3B.

One aspect of this description relates to a three-dimensional integrated circuit (3DIC). The 3DIC includes a first substrate having a first surface and a second surface opposite to the first surface and a second substrate attached to the first surface of the first substrate. The 3DIC further includes an interconnect between attached to the first surface of the first substrate and the second substrate and a plurality of through vias formed in the first substrate and electrically coupled to the interconnect. The 3DIC further includes a protection layer over the second surface of the first substrate, wherein each of the plurality of through vias protrudes through the protection layer and a plurality of dies, each die of the plurality of dies attached to at least one through via of the plurality of through vias.

Another aspect of this description relates to a three-dimensional integrated circuit (3DIC). The 3DIC includes a first substrate having a first surface and a second surface opposite to the first surface and a second substrate attached to the first surface of the first substrate. The 3DIC further includes a plurality of bond pads attached to the first surface of the first substrate and a plurality of through vias formed in the first substrate and electrically coupled to the bond pads. The 3DIC further includes a protection layer over the second surface of the first substrate, wherein each of the plurality of through vias is free of the protection layer and a plurality of dies, each die of the plurality of dies attached to at least one through via of the plurality of through vias.

Yet another aspect of this description relates to a three-dimensional integrated circuit (3DIC). The 3DIC includes a substrate having a first surface and a second surface opposite to the first surface and an integrated circuit (IC) card attached to the first surface of the first substrate through an anisotropically conductive connection film. The 3DIC further includes a plurality of bond pads attached to the first surface of the first substrate and a plurality of through vias formed in the first substrate and electrically coupled to the bond pads. The 3DIC further includes a protection layer over the second surface of the first substrate, wherein each of the plurality of through vias extends through the protection layer and a plurality of dies, each die of the plurality of dies attached to at least one through via of the plurality of through vias.

In the preceding detailed description, the disclosure is described with reference to specifically exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concepts as expressed herein.

What is claimed is:

1. A three-dimensional integrated circuit, comprising:
   a first substrate having a first surface and a second surface opposite to the first surface, wherein the first substrate has a thickness ranging from about 5 micrometers (μm) to about 50 μm;
   a second substrate attached to the first surface of the first substrate;
   an interconnect between attached to the first surface of the first substrate and the second substrate;
   a plurality of through vias formed in the first substrate and electrically coupled to the interconnect;
   a protection layer over the second surface of the first substrate, wherein each of the plurality of through vias protrudes through the protection layer; and
   a plurality of dies, each die of the plurality of dies attached to at least one through via of the plurality of through vias.

2. The 3DIC of claim 1, wherein the protection layer comprises at least one of an oxide film, a nitride film, a carbide film, a polymer-based material, a resin-based material, polyimide, or a spin-on material.

3. The 3DIC of claim 1, further comprising at least one conductive structure configured to attach each of the plurality of dies to at least one of the plurality of through vias.

4. The 3DIC of claim 3, wherein the at least one conductive structure comprises at least one solder bump or at least one copper bump.

5. The 3DIC of claim 3, wherein the at least one conductive structure comprises a redistribution layer.

6. The 3DIC of claim 1, wherein each die of the plurality of dies comprises at least one of a memory chip, a radio frequency chip, or a logic chip.

7. The 3DIC of claim 1, wherein the second substrate comprises at least one of glass, metal, ceramic, or polymer.

8. The 3DIC of claim 1, wherein each through via of the plurality of through vias are electrically coupled to a bond pad on the first surface of the first substrate and to a die of the plurality of dies on a second surface of the first substrate.

9. The 3DIC of claim 1, wherein the second substrate is an integrated circuit card, and the second substrate is attached to the first substrate through an anisotropically conductive connection film.

10. A three-dimensional integrated circuit, comprising:
    a first substrate having a first surface and a second surface opposite to the first surface, wherein the first substrate has a thickness ranging from about 5 micrometers (μm) to about 50 μm;
    a second substrate attached to the first surface of the first substrate;
    a plurality of bond pads attached to the first surface of the first substrate;
    a plurality of through vias formed in the first substrate and electrically coupled to the bond pads;
    a protection layer over the second surface of the first substrate, wherein each of the plurality of through vias is free of the protection layer; and
    a plurality of dies, each die of the plurality of dies attached to at least one through via of the plurality of through vias.

11. The 3DIC of claim 10, wherein the protection layer comprises at least one of an oxide film, a nitride film, a carbide film, a polymer-based material, a resin-based material, polyimide, or a spin-on material.

12. The 3DIC of claim 10, further comprising at least one conductive structure configured to attach each of the plurality of dies to at least one of the plurality of through vias.

13. The 3DIC of claim 12, wherein the at least one conductive structure comprises at least one solder bump or at least one copper bump.

14. The 3DIC of claim 12, wherein the at least one conductive structure comprises a redistribution layer.

15. The 3DIC of claim 10, wherein each die of the plurality of dies comprises at least one of a memory chip, a radio frequency chip, or a logic chip.

16. The 3DIC of claim 10, wherein the second substrate comprises at least one of glass, metal, ceramic, or polymer.

17. The 3DIC of claim 10, wherein the second substrate is an integrated circuit card, and the second substrate is attached to the first substrate through an anisotropically conductive connection film.

18. A three-dimensional integrated circuit, comprising:
a substrate having a first surface and a second surface opposite to the first surface, wherein the first substrate has a thickness ranging from about 5 micrometers (μm) to about 50 μm;
an integrated circuit card attached to the first surface of the substrate through an anisotropically conductive connection film;
a plurality of bond pads attached to the first surface of the substrate;
a plurality of through vias formed in the substrate and electrically coupled to the bond pads;
a protection layer over the second surface of the substrate, wherein each of the plurality of through vias extends through the protection layer; and
a plurality of dies, each die of the plurality of dies attached to at least one through via of the plurality of through vias.

\* \* \* \* \*